(12) United States Patent
Chen

(10) Patent No.: US 9,911,687 B2
(45) Date of Patent: Mar. 6, 2018

(54) MOLDING COMPOUND STRUCTURE

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/225,670

(22) Filed: Aug. 1, 2016

(65) Prior Publication Data

US 2016/0343649 A1  Nov. 24, 2016

Related U.S. Application Data

(62) Division of application No. 13/773,068, filed on Feb. 21, 2013, now Pat. No. 9,406,596.

(51) Int. Cl.
| | |
|---|---|
| *H01L 23/00* | (2006.01) |
| *H01L 23/498* | (2006.01) |
| *H01L 25/065* | (2006.01) |
| *H01L 25/00* | (2006.01) |
| *H01L 21/56* | (2006.01) |
| *H01L 23/31* | (2006.01) |
| *H01L 23/38* | (2006.01) |
| *H01L 21/48* | (2006.01) |
| *H01L 25/10* | (2006.01) |

(52) U.S. Cl.
CPC ...... *H01L 23/49811* (2013.01); *H01L 21/561* (2013.01); *H01L 23/3128* (2013.01); *H01L 23/49816* (2013.01); *H01L 23/49894* (2013.01); *H01L 24/97* (2013.01); *H01L 25/0657* (2013.01); *H01L 25/50* (2013.01); *H01L 21/48* (2013.01); *H01L 21/56* (2013.01);

*H01L 21/563* (2013.01); *H01L 21/565* (2013.01); *H01L 23/31* (2013.01); *H01L 23/38* (2013.01); *H01L 24/73* (2013.01); *H01L 25/105* (2013.01); *H01L 2224/131* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01);

(Continued)

(58) Field of Classification Search
CPC .................................. H01L 23/49811
See application file for complete search history.

(56) References Cited

U.S. PATENT DOCUMENTS

2003/0178709 A1* 9/2003 Andoh .................... H01L 21/56
257/667
2003/0207500 A1  11/2003 Pichler et al.
(Continued)

FOREIGN PATENT DOCUMENTS

KR  20080077177 A  8/2008
KR  20120087651 A  8/2012
(Continued)

*Primary Examiner* — William Harriston
(74) *Attorney, Agent, or Firm* — Slater Matsil, LLP

(57) ABSTRACT

A device comprises a package component comprising a plurality of bumps formed on a first side of the package component, a semiconductor die mounted on the first side of the package component, a dielectric material formed over the first side of the package component, wherein four corners of the top surface of the package component are free from the dielectric material and a top package bonded on the first side of the package component, wherein the semiconductor die is located between the top package and the package component.

20 Claims, 9 Drawing Sheets

(52) U.S. Cl.
CPC ............ *H01L 2224/92125* (2013.01); *H01L 2224/97* (2013.01); *H01L 2225/0651* (2013.01); *H01L 2225/06562* (2013.01); *H01L 2225/1023* (2013.01); *H01L 2225/1058* (2013.01); *H01L 2924/15331* (2013.01); *H01L 2924/181* (2013.01); *H01L 2924/1815* (2013.01); *H01L 2924/18161* (2013.01); *H01L 2924/351* (2013.01)

(56) References Cited

U.S. PATENT DOCUMENTS

| | | |
|---|---|---|
| 2005/0147924 A1 | 7/2005 | Cornwell et al. |
| 2007/0141751 A1 | 6/2007 | Mistry et al. |
| 2011/0117700 A1* | 5/2011 | Weng .................. H01L 21/56 438/109 |
| 2011/0147912 A1 | 6/2011 | Karpur et al. |
| 2012/0193779 A1 | 8/2012 | Lee et al. |

FOREIGN PATENT DOCUMENTS

| | | |
|---|---|---|
| TW | 568351 U | 12/2003 |
| TW | 200802789 | 1/2008 |

\* cited by examiner

MOLDING COMPOUND STRUCTURE

This application is a divisional of U.S. patent application Ser. No. 13/773,068, entitled "Molding Compound Structure," filed on Feb. 21, 2013 and issued as U.S. Pat. No. 9,406,596 on Aug. 2, 2016, which application is incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a molding compound layer structure for a package on package semiconductor device. The embodiments of the disclosure may also be applied, however, to a variety of semiconductor devices. Hereinafter, various embodiments will be explained in detail with reference to the accompanying drawings.

Figure 1:
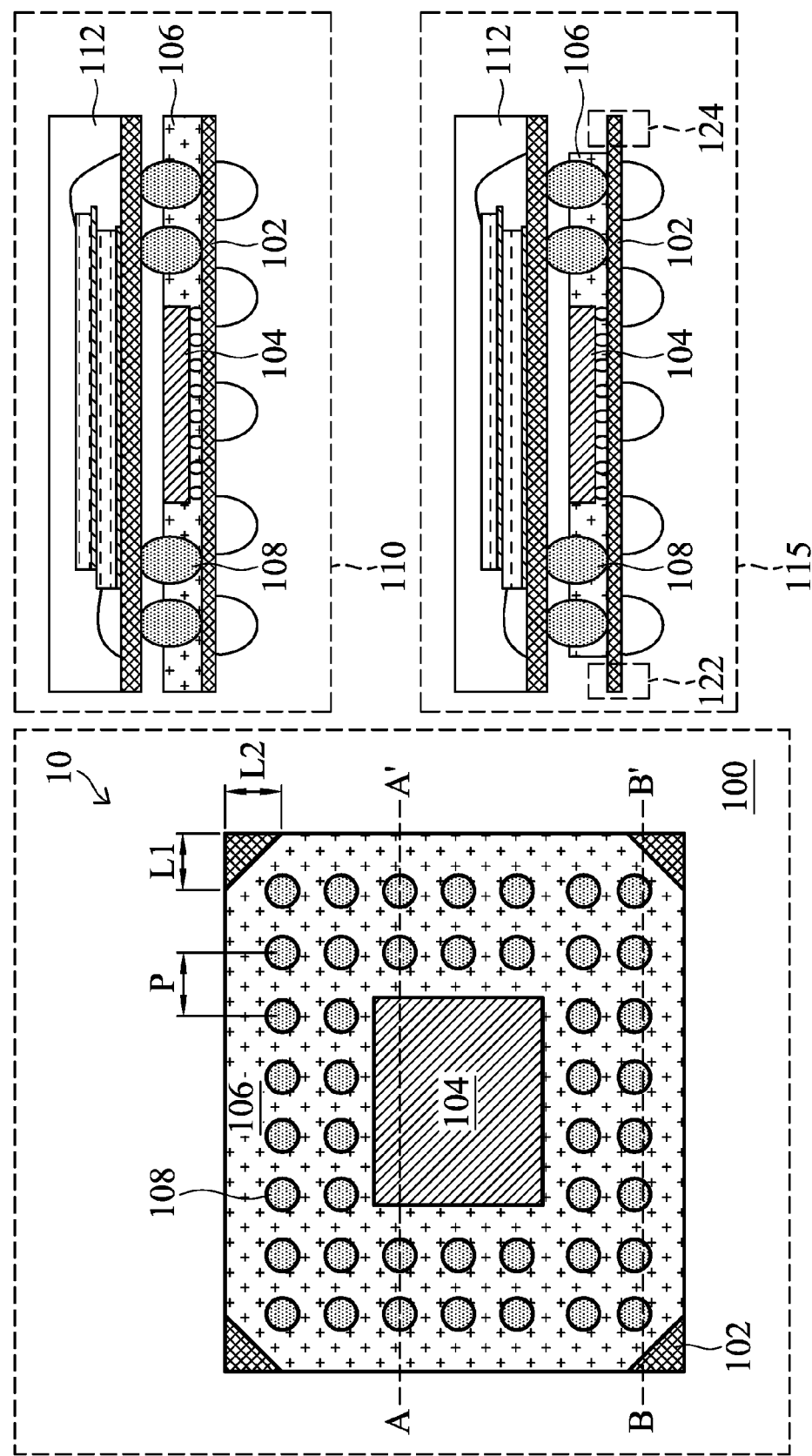
FIG. 1 illustrates a top view and two cross sectional views of a semiconductor device in accordance with various embodiments of the present disclosure.

FIG. 1 illustrates a top view and two cross sectional views of a semiconductor device in accordance with various embodiments of the present disclosure. A top view 100 of the semiconductor device 10 shows a semiconductor die 104 stacked on top of a package substrate 102. A plurality of bumps 108 are mounted on the top surface of the package substrate 102. In addition, as shown in FIG. 1, the bumps 108 are arranged in rows and columns. The pitch of the bumps 108 is defined as P. In some embodiments, P is in a range from about 350 um to about 450 um.

The semiconductor device 10 further comprises a molding compound layer 106 formed over the package substrate 102. The molding compound layer 106 is deposited on the top surface of the package substrate 102 except the four corners thereof. As shown in FIG. 1, the exposed corners of the package substrate 102 are triangular in shape. A first side of the corners may be of a first dimension L1. A second side of the corners may be of a second dimension L2. The dimensions (e.g., L1 and L2) of the corners may be subject to the following restriction. In some embodiments, the first dimension L1 and the second dimension L2 are greater than or equal to one half of the pitch P.

One advantageous feature of having the restriction shown above is that the dimension restriction helps to reduce the stress on the package on package structure of the semiconductor device 10. The reduced stress on the package on package structure helps to prevent some fabrication failures such as warpage and/or the like from occurring during subsequent fabrication steps and various reliability tests.

In some embodiments, by employing the molding compound layer 106 shown in FIG. 1, the stress on the package on package structure may be reduced by 30%. As a result, the reliability of the semiconductor device 10 may be improved.

In order to better illustrate the molding compound layer 106, cross sectional views 110 and 115 are taken along the lines A-A' and B-B' respectively. The cross sectional view 110 shows a package on package structure. A top package 112 is stacked on top of the package substrate 102 through a plurality of bumps 108. The semiconductor die 104 is attached to the top surface of the package substrate 102 through a plurality of micro bumps. The molding compound layer 106 is formed over the package substrate 102. The semiconductor die 104 is embedded in the molding compound layer 106.

The top package 112 may comprise a plurality of stacked dies, which may be wire bonded to the input and output terminals of the top package 112. The stacked dies of the top package 112 may comprise memory dies, logic dies, processor dies and/or the like. It should be noted while FIG. 1 illustrates two stacked dies in the top package 112, this is merely an example Likewise, the use of wire bonding is merely illustrative and other approaches for electrically connecting the stacked dies are within the contemplated scope of the present disclosure.

The cross sectional view 115 shown a structure similar to that of the cross section view 110 except that the molding compound layer 106 does not cover the corners of the top surface of the package substrate 102. As shown in the cross sectional view 115 of FIG. 1, the molding compound layer 106 is deposited on the top surface of the package substrate 102 except for the corners thereof. In particular, a left portion 122 adjacent to a first edge of the package substrate 102 and a right portion 124 adjacent to a second edge of the package substrate 102 are free from the molding compound material.

The molding compound layer 106 is deposited on the package substrate 102 through suitable deposition techniques. By employing a plurality of dummy blocks, the corners of the package substrate 102 may be free from the molding compound material. The detailed fabrication process will be described below with respect to FIGS. 4 and 5.

Figure 2:
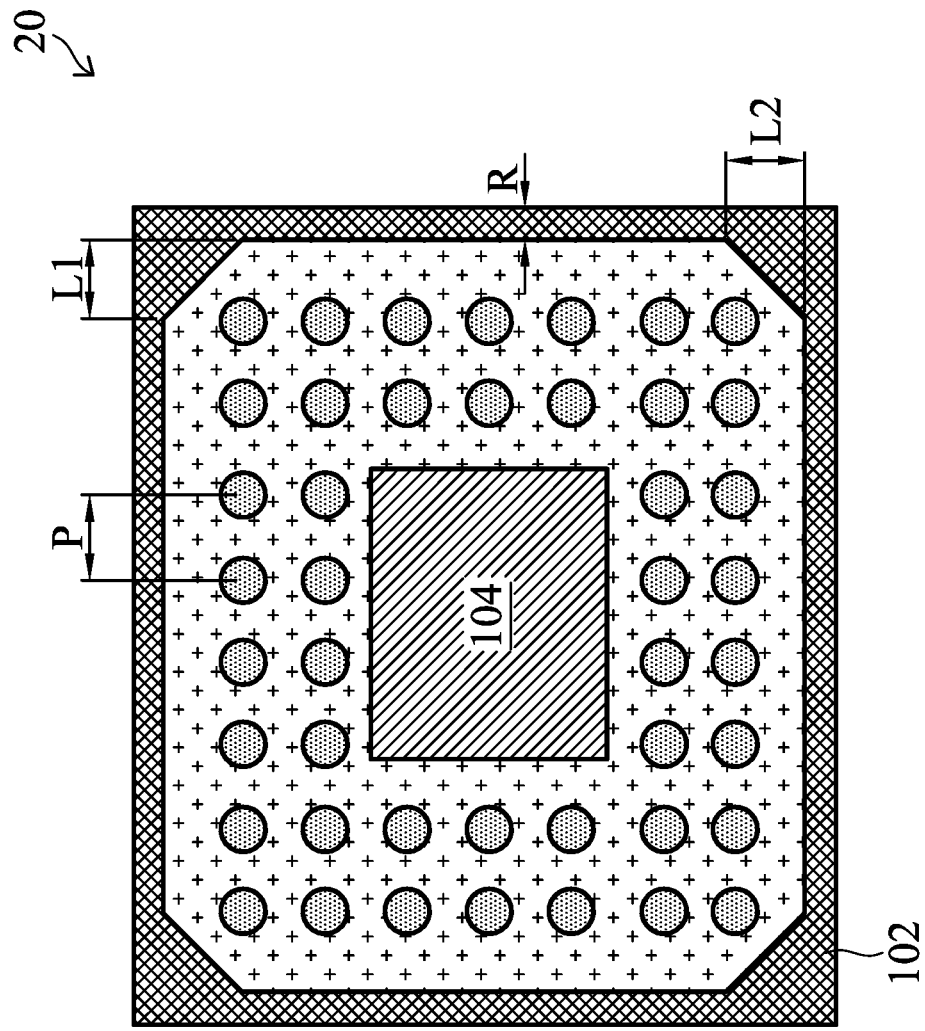
FIG. 2 illustrates a top view of another semiconductor device in accordance with various embodiments of the present disclosure.

FIG. 2 illustrates a top view of another semiconductor device in accordance with various embodiments of the present disclosure. The structure of the semiconductor device 20 shown in FIG. 2 is similar to the semiconductor device 10 shown in FIG. 1 except that four edge regions of the package substrate 102 are free from the molding compound material. P, L1 and L2 of FIG. 2 are similar to P, L1 and L2 of FIG. 2. In addition, the edge region's width is defined as R as shown in FIG. 2. In accordance with some embodiments, R is approximately equal to 50 um. The detailed formation process of the molding compound layer 106 shown in FIG. 2 will be described below with respect to FIG. 5.

FIGS. 3-7 illustrate immediate steps of fabricating the semiconductor devices shown in FIG. 1 and FIG. 2 in accordance with various embodiments of the present disclosure.

Figure 3:
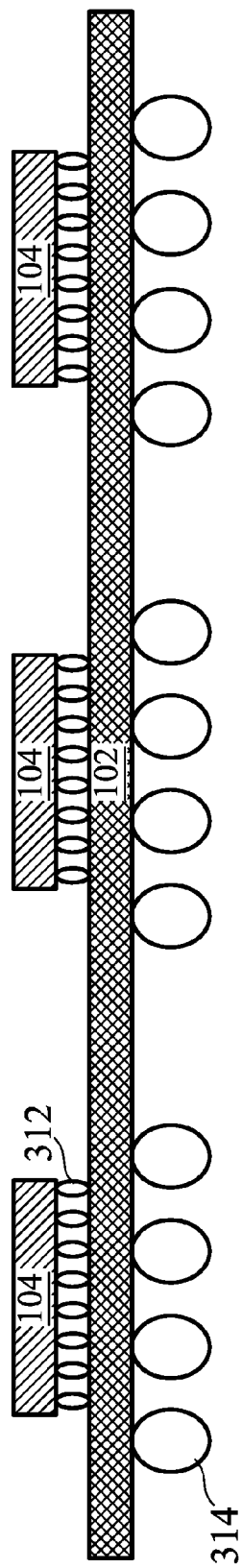
FIG. 3 illustrates a plurality of semiconductor dies bonded on top of a package component in accordance with various embodiments of the present disclosure.

FIG. 3 illustrates a plurality of semiconductor dies bonded on top of a package component in accordance with various embodiments of the present disclosure. The package component may be a silicon wafer. In some embodiments, the package component may be a standard wafer having a thickness more than 100 um. In alternative embodiments, the package component may be a silicon wafer with a thickness of about 770 um.

Furthermore, the package component may be a package substrate. Throughout the description, the package component is alternatively referred to as a package substrate 102. The package substrate 102 may be made of ceramic materials, organic materials, any combinations thereof and/or the like.

The package substrate 102 may comprise a plurality of integrated circuits (not shown), each of which may comprise various layers such as active circuit layers, substrate layers, inter-layer dielectric (ILD) layers and inter-metal dielectric (IMD) layers (not shown). The package substrate 102 may further comprise a plurality of through vias (not shown). In some embodiments, the through vias are through-substrate vias (TSVs) or through-silicon vias (TSVs). The active circuit layers of the package substrate 102 may be coupled to the semiconductor dies 104 bonded on the package substrate 102 through a conductive channel formed by the plurality of TSVs and micro bumps 312.

A dielectric layer (not shown) may be formed over the micro bump (e.g., micro bumps 312) side of the package substrate 102. The dielectric layer may be alternatively referred to as an ILD layer hereinafter. In some embodiments, the ILD layer is formed of a photo-sensitive material such as polybenzoxazole (PBO), polyimide, benzocyclobutene (BCB), any combinations thereof and/or the like, which may be easily patterned using a lithography mask. In alternative embodiments, the ILD layer may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer may be formed by suitable fabrication techniques such as such as spinning, CVD, and PECVD and/or the like.

A redistribution layer (not shown) may be formed over the top surface of the package substrate 102. In particular, the redistribution layer may be formed in/on the ILD layer. The redistribution layer provides a conductive path between TSVs of the package substrate 102 and the micro bumps 312. The redistribution layer may be formed of any suitable metal materials such as aluminum, aluminum alloys, copper, copper alloys, any combinations thereof and/or the like.

The ILD layer may have a plurality of openings (not shown), through which top surfaces of the redistribution layer are exposed. The exposed portions of the redistribution layer may function as bond pads. The semiconductor dies 104 are bonded on the bond pads through the micro bumps 312.

Semiconductor dies 104 are picked and placed on top of the package substrate 102. After a reflow process, the semiconductor dies 104 are bonded on the bond pads of the package substrate 102 through the micro bumps 312. In some embodiments, the bonding process may be a bump on trace (BOT) process. The detailed processes of bonding semiconductor dies on a package substrate are well known in the art, and hence are not discussed herein to avoid repetition.

It should be noted that while FIG. 3 illustrates three semiconductor dies 104 bonded on the package substrate 102, the package substrate 102 may accommodate any number of semiconductor dies.

In order to give a basic insight of the inventive aspects of various embodiments, as shown in FIG. 3, the semiconductor dies 104 are drawn without details. However, it should be noted that the semiconductor dies 104 may comprise basic semiconductor layers such as active circuit layers, substrate layers, ILD layers, IMD layers, dielectric layers and redistribution layers (not shown respectively).

The semiconductor dies 104 may comprise a substrate (not shown). In some embodiments, the substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a particular application.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

One of ordinary skill in the art will appreciate that the above examples are provided for illustrative purposes only to further explain applications of the present disclosure and are not meant to limit the present disclosure in any manner.

An isolation layer (not shown) is formed on the substrate. The isolation layer may be formed, for example, of a low-K dielectric material, such as silicon oxide. The isolation layer may be formed by any suitable method known in the art, such as spinning, chemical vapor deposition (CVD) and plasma enhanced chemical vapor deposition (PECVD). It should also be noted that one skilled in the art will recognize that the isolation layer may further comprise a plurality of dielectric layers.

A redistribution layer (not shown) may be formed on the isolation layer. The active circuit layer (not shown) of the semiconductor die 104 may be bridged by the redistribution layer so that the active circuit layer of the semiconductor die 104 can be coupled to the input and output (I/0) terminals of thereof.

The bumps (e.g., micro bumps 312) provide an effective way to connect the semiconductor dies 104 with the package substrate 102. The bumps are I/0 terminals of the semiconductor dies 104. In some embodiments, the bumps (e.g., micro bumps 312) may be a plurality of solder balls.

After the semiconductor dies (e.g., semiconductor dies 104) are bonded on the package substrate 102, an underfill material layer (not shown) may be formed in the gap between the package substrate 102 and the plurality of semiconductor dies (e.g., the semiconductor die 104) mounted on top of the package substrate 102. In some embodiments, the underfill material layer may be an epoxy, which is dispensed at the gap between the package substrate 102 and the semiconductor dies 104. The epoxy may be applied in a liquid form, and may harden after a curing process. In alternative embodiments, the underfill layer may be formed of curable materials such as polymer based materials, resin based materials, polyimide, epoxy and any combinations of thereof.

The underfill layer can be formed by a spin-on coating process, dry film lamination process and/or the like. An advantageous feature of having an underfill material layer is that the underfill material layer helps to prevent the micro bumps 312 from cracking. In addition, the underfill material layer may help to reduce the mechanical and thermal stresses on the semiconductor dies 104 during the fabrication process.

Figure 4:
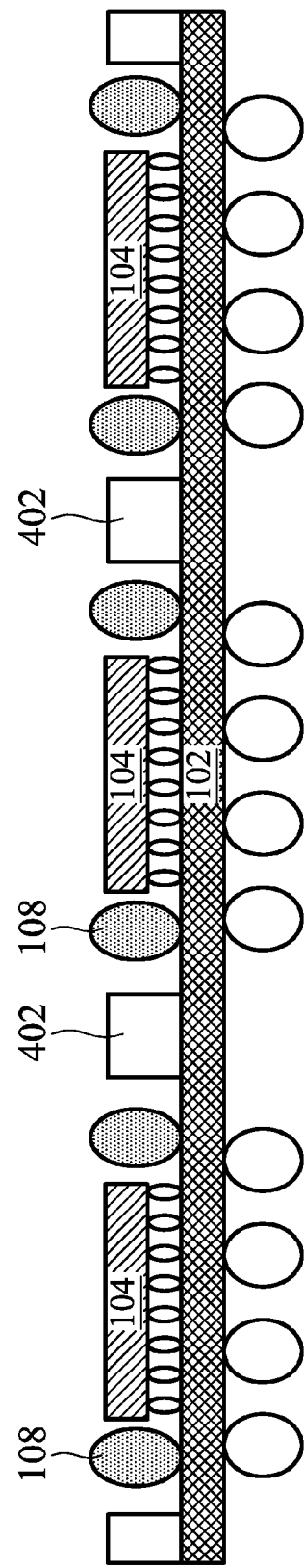
FIG. 4 illustrates a cross sectional view of the semiconductor device shown in FIG. 3 after a plurality of dummy blocks are mounted between adjacent semiconductor dies in accordance with various embodiments of the present disclosure.

FIG. 4 illustrates a cross sectional view of the semiconductor device shown in FIG. 3 after a plurality of dummy blocks are mounted between adjacent semiconductor dies in accordance with various embodiments of the present disclosure. The dummy blocks 402 may be attached to the top surface of the package substrate 102 by suitable bonding techniques. The dummy blocks 402 may be formed of suitable materials such as glass, steel, silicon and/or the like.

As shown in FIG. 4, the dummy blocks 402 are level with the semiconductor dies 104. Referring back to FIG. 1, the package substrate 102 may be of a plurality of subdivisions, each of which accommodates a semiconductor die (e.g., semiconductor die 104). The dummy blocks 402 may be placed on four corners of each subdivision. As a result, a subsequently formed molding compound layer (shown in FIG. 5) does not cover the four corners of each subdivision.

In alternative embodiments, the dummy blocks 402 may be of a ring shape. Referring back to FIG. 2, in each subdivision of the package substrate 102, a ring shaped dummy block 402 may cover the four corners as well as four edge regions of the top surface of the package substrate 102 so that a subsequently formed molding compound layer does not cover the four corners and edge regions of the top surface of the package substrate 102.

A release layer (not shown) may be employed to temporarily bond the dummy block 402 on the package substrate 102. In some embodiments, the release layer may be formed of an epoxy-based thermal-release material. In alternative embodiments, the release layer may be formed of an ultra-violet (UV) glue, which loses its adhesive property when exposed to UV lights.

The release layer may be formed over the package substrate 102 by any suitable semiconductor fabrication techniques. In some embodiments, the release layer may be dispensed as a liquid and cured subsequently. In alternative embodiments, the release layer may be laminated onto the package substrate 102.

FIG. 4 further illustrates a plurality of bumps 108 formed over the top surface of the package substrate 102. The bumps 108 are employed to connect the package substrate 102 with the top package (not shown but illustrated in FIG. 1).

Figure 5:
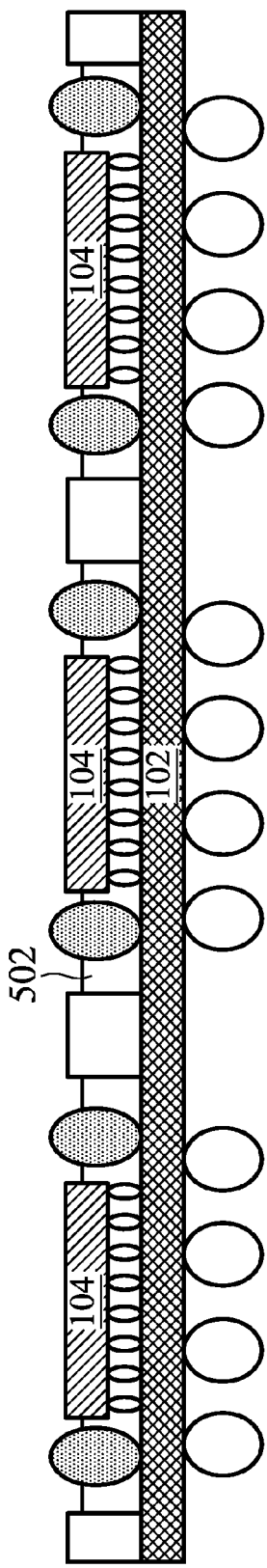
FIG. 5 illustrates a cross sectional view of the semiconductor device shown in FIG. 4 after a molding compound layer is formed on top of the package substrate in accordance with various embodiments of the present disclosure.

FIG. 5 illustrates a cross sectional view of the semiconductor device shown in FIG. 4 after a molding compound layer is formed on top of the package substrate in accordance with various embodiments of the present disclosure. As shown in FIG. 5, the semiconductor dies 104 are embedded in a molding compound layer 502. The molding compound layer 502 may be formed of curable materials such as polymer based materials, resin based materials, polyimide, epoxy and any combinations of thereof. It should be noted that throughout the description, the molding compound layer may be alternatively referred to as an encapsulation layer.

The molding compound layer 502 can be formed by a spin-on coating process, an injection molding process and/or the like. One advantageous feature of having a molding compound layer on the package substrate 102 is that during process steps such as a backside grinding process of the semiconductor device, the molding compound layer 502 is employed to keep the package substrate 102 and the semiconductor dies 104 on top of the package substrate 102 from cracking, bending, warping and/or the like.

Figure 6:
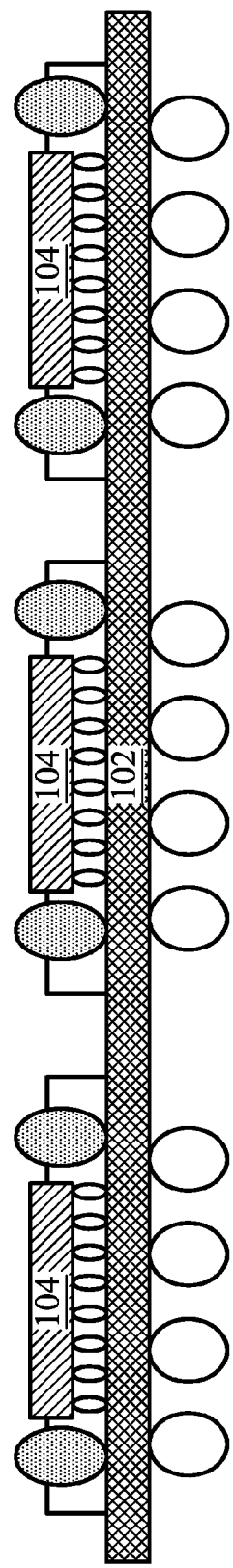
FIG. 6 illustrates a cross sectional view of the semiconductor device shown in FIG. 5 after the dummy blocks are detached from the package substrate in accordance with various embodiments of the present disclosure.

FIG. 6 illustrates a cross sectional view of the semiconductor device shown in FIG. 5 after the dummy blocks are detached from the package substrate in accordance with various embodiments of the present disclosure. A variety of detaching processes may be employed to separate the dummy blocks 402 from the package substrate 102. In some embodiments, the variety of detaching processes may comprise a chemical solvent, a UV exposure and/or the like.

Figure 7:
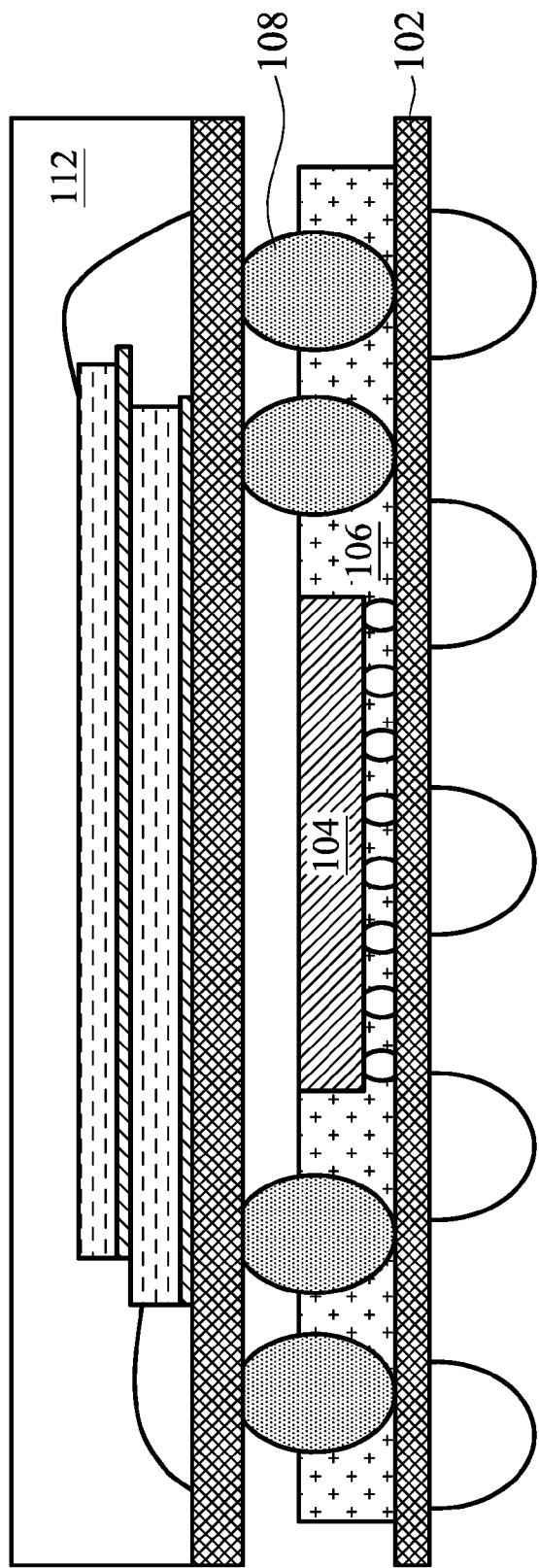
FIG. 7 illustrates an individual chip package after a dicing process is applied to the semiconductor device shown in FIG. 6 in accordance with various embodiments of the present disclosure.

FIG. 7 illustrates an individual chip package after a dicing process is applied to the semiconductor device shown in FIG. 6 in accordance with various embodiments of the present disclosure. The dicing process is well known in the art, and hence is not discussed in detail herein. A top package 112 is bonded on top of the individual chip package to form a package on package structure as shown in FIG. 7. The detailed structure of the package on package structure has been described above with respect to FIG. 1, and hence is not discussed herein to avoid repetition.

Figure 8:
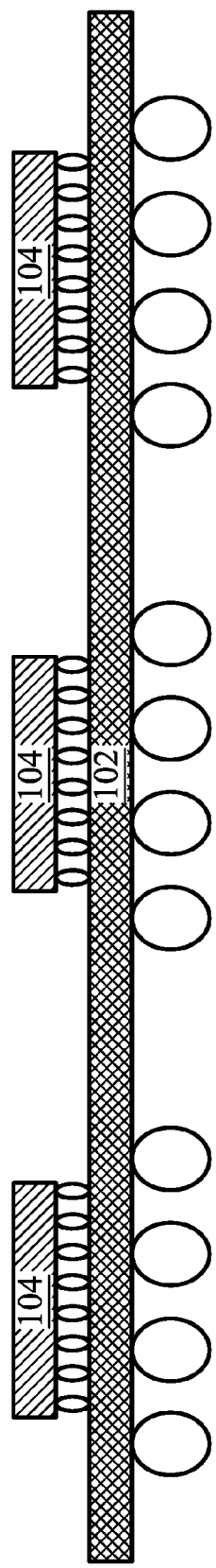
FIGS. 8-12 are cross sectional views of intermediate stages in the making of a package on package semiconductor device in accordance with another embodiment.

FIGS. 8-12 are cross sectional views of intermediate stages in the making of a package on package semiconductor device in accordance with another embodiment. The initial step of this embodiment shown in FIG. 8 is the same as the fabrication step shown in FIG. 3, and hence are not discussed herein again to avoid repetition.

Figure 9:
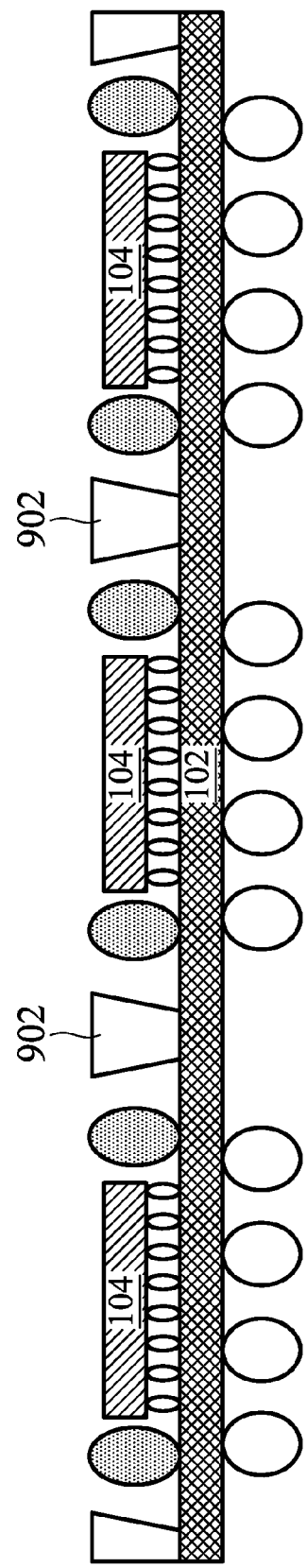
Figure 10:
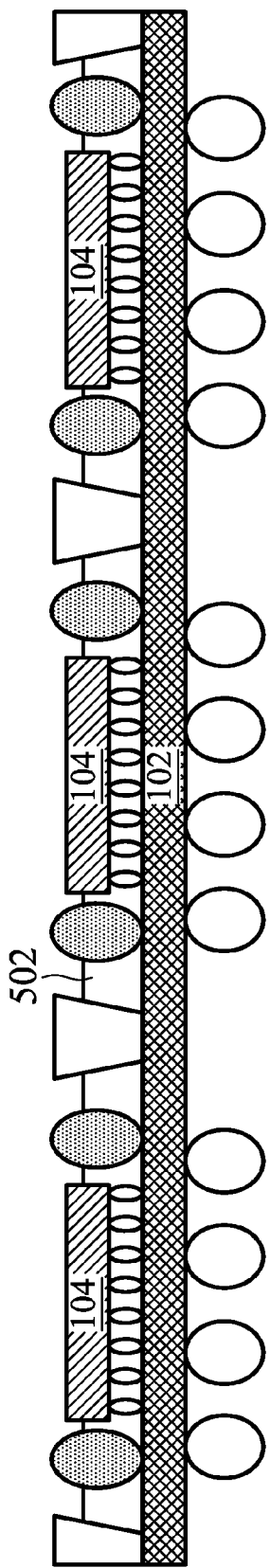
Figure 11:
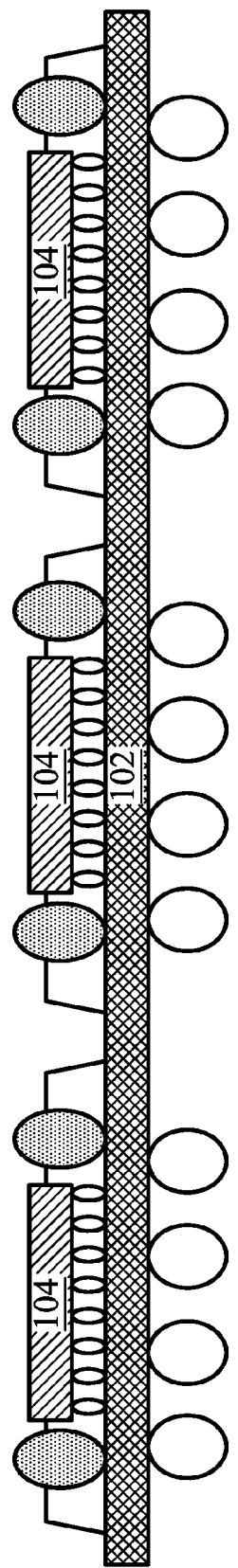
Figure 12:
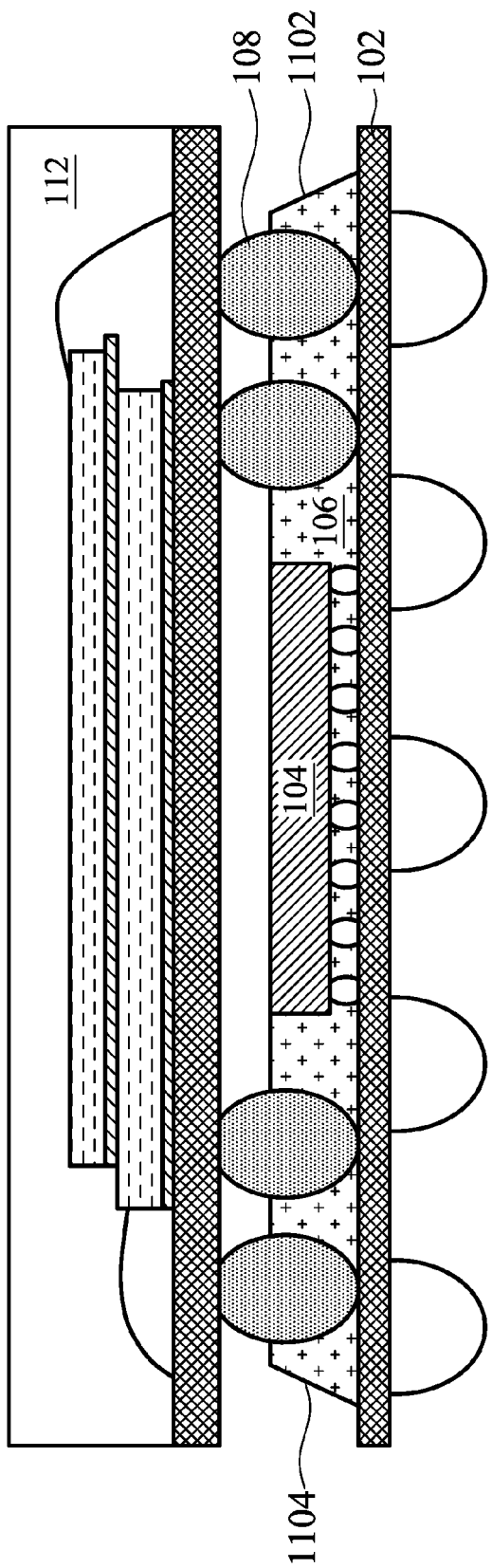

FIGS. 9-12 are similar to FIGS. 4-7 except that the dummy blocks 902 shown in FIG. 9 is of a reverse trapezoidal shape rather than a rectangular shape. The molding compound layer deposition process shown in FIG. 10, the detaching process shown in Figure 11 and the dicing process shown in FIG. 12 have been described above with respect to FIGS. 5-7, and hence are not discuss again to avoid repetition FIG. 12 illustrates a cross sectional view of an individual chip package after a dicing process is applied to the semiconductor device shown in FIG. 11 in accordance with various embodiments of the present disclosure. As shown in FIG. 12, the structure of the semiconductor device is similar to that shown in FIG. 7 except that there may be a slope (e.g., slope 1102 or slope 1104) rather than a step at each side of the molding compound layer 106. In other words, the molding compound layer 106 may be of a trapezoidal shape. The slopes (e.g., slope 1102) and the package substrate may form an angle. The angle is known as a sidewall angle of the molding compound layer 106. In some embodiments, the sidewall angle is in a range from about 50 degrees to about 80 degrees.

Figure 13:
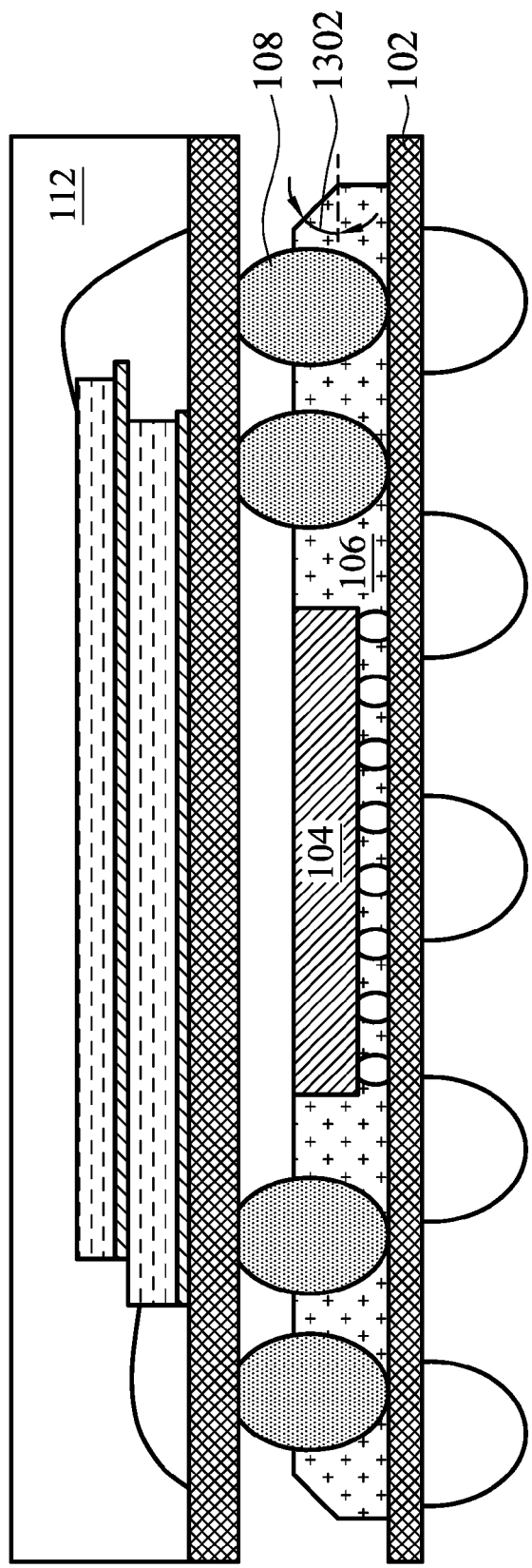
FIG. 13 illustrates a cross sectional view of another individual chip package in accordance with various embodiments of the present disclosure.

FIG. 13 illustrates a cross sectional view of another individual chip package in accordance with various embodiments of the present disclosure. As shown in FIG. 13, the cross sectional view of the individual chip package is similar to the cross sectional view of the individual chip package shown in FIG. 12 except that the molding compound layer 106 is a snip same side corner rectangle as shown in FIG. 12. In other words, the cross sectional view of the molding compound layer 106 is formed by a combination of a rectangular portion and a trapezoidal portion.

As shown in FIG. 13, the trapezoidal portion is stacked on the rectangular portion. The trapezoidal portion of FIG. 13 is similar to the trapezoidal molding compound layer shown in FIG. 12. The trapezoidal portion is of an angle 1302. In some embodiments, the angle 1302 is in range from about 50 degrees to about 80 degrees. It should be noted that the shapes of the molding compound layers in FIG. 7, FIG. 12 and FIG. 13 are merely example. It is within the scope and spirit of various embodiments for the molding compound layer 106 to comprise other shapes.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   placing a semiconductor die in a subdivision of a top surface of a package substrate;
   placing dummy blocks at four corners of the subdivision;
   forming a plurality of bumps on the top surface of the package substrate, wherein the bumps are arranged in rows and columns;
   depositing an encapsulation layer over the top surface of the package substrate, wherein the semiconductor die is embedded in the encapsulation layer;
   detaching the dummy blocks from the package substrate, wherein at least one sidewall of the encapsulation layer is a non-zero slope extending from a top surface of the encapsulation layer to a bottom surface of the encapsulation layer after detaching the dummy blocks; and
   attaching a top package to the package substrate, wherein:
      the semiconductor die is located between the package substrate and the top package; and
      the top package and the package substrate are connected together through the bumps.

2. The method of claim 1, further comprising:
   attaching a release layer over each corner of the package substrate;
   attaching a dummy block to the package substrate through the release layer; and
   performing a release process on the package substrate to detach the dummy block.

3. The method of claim 1, further comprising:
   attaching a release layer over an edge region of the top surface of the package substrate;
   attaching an edge region dummy block to the package substrate through the release layer; and
   performing a release process on the package substrate to detach the edge region dummy block.

4. The method of claim 1, further comprising:
   attaching a ring shaped dummy block on the top surface of the package substrate, wherein the ring shaped dummy block covers four corners and four edge regions of the subdivision of the package substrate.

5. A method comprising:
   placing a semiconductor die in a subdivision of a top surface of a package substrate;
   placing a dummy device covering at least a first corner of the subdivision;
   forming a plurality of bumps on the top surface of the package substrate, wherein the bumps are arranged in rows and columns;
   depositing a molding compound layer over the package substrate, wherein the semiconductor die is embedded in the molding compound layer and a lower portion of the dummy device is surrounded by the molding compound layer; and
   detaching the dummy device from the package substrate.

6. The method of claim 5, further comprising:
   attaching a top package to the package substrate, wherein:
      the semiconductor die is located between the package substrate and the top package; and
      the top package and the package substrate are connected together through the bumps.

7. The method of claim 5, wherein:
   the dummy device is a ring covering four corners and four edge regions of the subdivision of the package substrate.

8. The method of claim 5, wherein:
   the dummy device comprises a dummy block rectangular in shape.

9. The method of claim 5, wherein:
   the dummy device comprises a dummy block trapezoidal in shape.

10. The method of claim 5, wherein:
    the dummy device comprises a first dummy block at a first corner of the subdivision, a second dummy block at a second corner of the subdivision, a third dummy block at a third corner of the subdivision and a fourth dummy block at a fourth corner of the subdivision.

11. The method of claim 5, wherein:
the dummy device comprises a dummy block, and wherein the dummy block includes an upper portion trapezoidal in shape and a lower portion rectangular in shape.

12. A method comprising:
placing a semiconductor die in a subdivision of a top surface of a package substrate;
placing a first dummy device, a second dummy device, a third dummy device and a fourth dummy device adjacent to a first corner, a second corner, a third corner and a fourth corner of the subdivision, respectively;
forming a plurality of bumps on the top surface of the package substrate, wherein the plurality of bumps are between the semiconductor die and the dummy devices;
depositing a dielectric material to form an encapsulation layer over the package substrate, wherein the semiconductor die is embedded in the encapsulation layer, and lower portions of the first dummy device, the second dummy device, the third dummy device and the fourth dummy device are enclosed by the dielectric material in a plan view;
detaching the first dummy device, the second dummy device, the third dummy device and the fourth dummy device from the package substrate; and
attaching a top package to the package substrate.

13. The method of claim 12, wherein:
after detaching the first dummy device, the second dummy device, the third dummy device and the fourth dummy device from the package substrate, four corners of the top surface of the package substrate are free from the dielectric material.

14. The method of claim 12, wherein:
the first dummy device is trapezoidal in shape from a cross sectional view.

15. The method of claim 12, further comprising:
attaching the semiconductor die to the package substrate through a plurality of micro bumps.

16. The method of claim 12, further comprising:
attaching a release layer over the package substrate; and
attaching the first dummy device to the top surface of the package substrate through the release layer.

17. The method of claim 12, wherein:
the semiconductor die is between the package substrate and the top package.

18. The method of claim 12, wherein:
the top package and the package substrate are connected together through the plurality of bumps.

19. The method of claim 12, wherein:
the first dummy device is rectangular in shape.

20. The method of claim 12, wherein:
the plurality of bumps are arranged in rows and columns.

* * * * *